United States Patent [19]

Grudkowski

[11] Patent Number: 4,499,440

[45] Date of Patent: Feb. 12, 1985

[54] LOW REFLECTIVITY ELECTRODES IN SEMICONDUCTIVE SAW DEVICES

[75] Inventor: Thomas W. Grudkowski, Glastonbury, Conn.

[73] Assignee: United Technologies Corporation, Hartford, Conn.

[21] Appl. No.: 525,204

[22] Filed: Aug. 22, 1983

[51] Int. Cl.³ .................. H03H 9/13; H03H 9/25; H03H 9/42

[52] U.S. Cl. .................. 333/151; 310/313 R; 333/154; 333/194; 357/26

[58] Field of Search .................. 333/150–155, 333/193–196; 357/26, 55; 310/313 R, 313 A, 313 B, 313 C, 313 D; 364/821; 330/5.5; 331/107 A

[56] References Cited

U.S. PATENT DOCUMENTS 4,130,813 12/1978 Sandy et al. .................. 310/313 D X
4,237,433 12/1980 Tanski .................. 333/196 X
4,336,549 6/1982 Ladd, Jr. .................. 357/55 X Primary Examiner—Marvin L. Nussbaum
Attorney, Agent, or Firm—M. P. Williams

[57] ABSTRACT

Low reflectivity electrodes (2–4) are formed within recesses extending from a major surface of a semiconductive and piezoelectric substrate (1) (such as gallium arsenide) so as to reduce SAW reflectivity from the electrodes.

2 Claims, 1 Drawing Figure

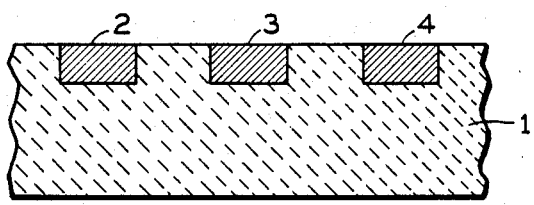

LOW REFLECTIVITY ELECTRODES IN SEMICONDUCTIVE SAW DEVICES

DESCRIPTION

1. Technical Field

This invention relates to surface acoustic wave (SAW) devices and more particularly to provision of electrodes having low SAW reflectivity in semiconductive SAW devices.

2. Background Art

The utilization of piezoelectric material (such as quartz and lithium niobate) to provide surface acoustic wave devices is well known. Such devices may be simply tapped delay lines, resonators, oscillators, or more sophisticated signal processors such as transversal filters. A primary limitation on the performance of devices which rely on surface acoustic waves is the acoustic reflections which occur between input and output transducers or between various types of electrodes or taps which are situated within the acoustic propagation path. These reflections manifest themselves as undesirable perturbations of various types: the frequency response of a filter; unwanted spurious responses; dynamic range degradation; and, in SAW convolver or correlator applications, decreased peak-to-sidelobe performance.

In the case of SAW reflections in devices employing quartz substrates, reflection of the SAW wave by the electrodes has been significantly reduced by recessing the electrodes in the quartz so as to achieve electrode surfaces which are coplanar with the substrate surface, as reported by Tanski et al, "The Design of SAW Resonators on Quartz With Emphasis on Two Ports", *Proceedings of the 1976 Ultrasonic Symposium*, IEEE No. 76CH1120-5SU, pp 260–265, 1976, and by Li, "310-MHz SAW Resonator With Q at the Material Limit," *Applied Physics Letters*, Volume 31, No. 7, 1977, pp 407–409.

In contrast, attempts to reduce reflectivity in lithium niobate SAW devices have required use of double electrodes operating at an eighth of a wavelength periodicity, as reported by Bristol et al, "Applications of Double Electrodes in Acoustic Surface Wave Device Design", *Proceedings of the 1972 IEEE Ultrasonics Symposium*, pp 343–345. However, the required resolution is difficult to attain in high frequency devices; and, the technique may be inapplicable to FET tap structures.

There are a large number of SAW devices which require or utilize semiconductive properties along with piezoelectric properties. These include: an internal mixing SAW signal processor described in U.S. Pat. No. 4,207,546; the isolated gate FET SAW signal processor of U.S. Pat. No. 4,247,903; the programmable internal mixing signal processor of U.S. Pat. No. 4,328,473; and, the carrier concentration controlled variable delay devices and resonator/oscillator of U.S. Pat. Nos. 4,233,573 and 4,354,166. These and other devices require that the SAW substrate have both piezoelectric and semiconductive properties, as do any monolithic devices which include electronic devices on the same substrate as the SAW device associated therewith. The utilization of a gallium arsenide substrate is known to provide the combined electronic and acoustic properties required for such devices.

A difficulty in providing SAW devices which employ electronic phenomenon within the acoustic path itself is the need to provide both ohmic and rectifying contact between the electrodes and the substrate, in dependence upon the function being performed. For instance, the launching and receiving transducers must have rectifying contact with the substrate, as do the gates of any field effect devices formed therein. On the other hand, the source and drain and other conductors may require ohmic contact with the substrate. Thus, the difficulty of providing low reflection is compounded by the need for different electric contact with the substrate.

DISCLOSURE OF INVENTION

Objects of the invention include reduction of SAW reflection from electrodes in semiconductive SAW devices.

According to the present invention, electrodes in semiconducting SAW devices comprise aluminum, or layers of chromium, aluminum and chromium, buried within the surface of a gallium arsenide substrate. In accordance with the invention in one form, non-ohmic contacts (such as Schottky barriers) are provided by minimizing or repairing the damage to the substrate material which occurs when forming slots within the substrate within which the electrodes are to be formed so that good rectifying junctions are provided. In accordance further with the invention, ohmic contacts are formed by either (or a combination of) providing a high degree of surface destruction in the grooves within which the electrodes are to be formed, or enhancing the conductivity of the substrate adjacent the formed electrodes, such as by ion bombardment and annealing and/or by depositing additional, highly doped substrate material prior to formation of the electrodes.

The invention provides SAW devices having electrical as well as acoustical properties inherent therein, utilizing both ohmic and rectifying-junction electrical contact to the substrate, with low SAW reflectivity.

The foregoing and other objects, features and advantages of the present invention will become more apparent in the light of the following detailed description of exemplary embodiments thereof, as illustrated in the accompanying drawing.

BRIEF DESCRIPTION OF DRAWINGS

The sole FIGURE herein is a simplified sectional view of a segment of a SAW device employing electrodes buried in the surface thereof in accordance with the present invention.

BEST MODE FOR CARRYING OUT THE INVENTION

Referring now to the drawing, a SAW device 1 includes a plurality of electrodes 2–4 each of which comprises aluminum, or layers of chromium, aluminum and chromium, deposited within notches or grooves formed within the substrate, to provide electrodes, the upper surfaces of which are essentially coplanar with the upper surfaces of the substrate 1. To provide rectifying junctions, such as may be used for launching and receiving transducers or for gates of FET taps formed on the substrate 1, ion milling (ion-beam etching) of a well known type may be utilized in conjunction with photoresist masking of a known type. Then, the metal may be deposited through the same mask utilizing vapor deposition, sputter deposition, or electron-beam deposition of a known type. The unwanted metal can then be removed with a well known lift-off process. To improve the quality of the Schottky barriers, reactive ion etching or chemical etching may be utilized in place of ion milling in order to reduce the damage to the gallium arsenide semiconducting properties. In the case of the desire for ohmic contacts, such as for the source and drain of FET taps on the surface of the device, ion milling is preferred since the damaged surface will enhance the ohmic conductivity between the metal and the substrate. In addition, the ohmic contact can be improved by following ion milling with enhancing the carrier concentration at the surfaces of the grooves, either by depositing additional, highly doped substrate material or by ion bombardment followed by annealing prior to depositing the metal within the grooves.

As is known, thin layers of chromium may be deposited before the aluminum is deposited, in order to cause greater adherence of the aluminum to the gallium arsenide substrate. In addition, a thin layer of chromium may be deposited at the surface following the deposition of the aluminum in order to passivate the aluminum during further processing of the substrate.

As an example, in a simple delay line employing the electrodes 2-4 as fingers of the interdigital launching and receiving transducers, triple transit reflection is reduced to 50-70 db below the main response, as compared with surface-mounted transducers in a similar device in which the triple transit reflection is only 15-25 dB below the main response. These results were achieved utilizing 200 angstroms of chromium at the bottom of the slots or grooves, followed by 1200 angstroms of aluminum, with 200 angstroms of chromium near the surface.

The example herein employs layers of chromium, aluminum and chromium. However, the electrodes may consist solely of aluminum, or may consist of aluminum with layers of other metals (such as titanium, tungsten or nickel) or mixtures (such as gold-germanium). Such layers should be very thin (about 0.1% of the acoustic wavelength) so as not to affect the velocity of the acoustic wave.

The present invention may find application in devices described and made in accordance with the teachings of the aforementioned patents, all of which are hereby incorporated herein by reference.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

I claim:

1. A surface acoustic wave device comprising:
a substrate of semiconductive gallium arsenide and a plurality of electrodes comprising aluminum disposed on said substrate, characterized by:
said electrodes being formed in recesses (slots, grooves) extending into said substrate from a major surface thereof, whereby the surface of the electrodes is essentially coplanar with said major surface of said substrate.

2. A surface acoustic wave device according to claim 1 wherein said electrodes comprise layers of chromium and aluminum.

* * * * *